(12) United States Patent
Nagasawa et al.

(10) Patent No.: US 12,177,971 B2
(45) Date of Patent: Dec. 24, 2024

(54) WIRING BOARD

(71) Applicant: KYOCERA Corporation, Kyoto (JP)

(72) Inventors: Tadashi Nagasawa, Soraku-gun (JP); Satoshi Yoshiura, Soraku-gun (JP)

(73) Assignee: KYOCERA Corporation, Kyoto (JP)

( * ) Notice: Subject to any disclaimer, the term of this patent is extended or adjusted under 35 U.S.C. 154(b) by 803 days.

(21) Appl. No.: 17/289,769

(22) PCT Filed: Oct. 23, 2019

(86) PCT No.: PCT/JP2019/041523
§ 371 (c)(1),
(2) Date: Apr. 29, 2021

(87) PCT Pub. No.: WO2020/090583
PCT Pub. Date: May 7, 2020

(65) Prior Publication Data
US 2021/0400809 A1   Dec. 23, 2021

(30) Foreign Application Priority Data

Nov. 2, 2018 (JP) .................................. 2018-207462

(51) Int. Cl.
*H05K 1/03* (2006.01)
*H01Q 9/04* (2006.01)
(Continued)

(52) U.S. Cl.
CPC ......... *H05K 1/0373* (2013.01); *H01Q 9/0407* (2013.01); *H01Q 13/08* (2013.01);
(Continued)

(58) Field of Classification Search
None
See application file for complete search history.

(56) References Cited

U.S. PATENT DOCUMENTS

2003/0016162 A1   1/2003   Sasada et al.
2006/0227051 A1   10/2006  Yamamoto et al.
(Continued)

FOREIGN PATENT DOCUMENTS

JP   08-008639 A   1/1996
JP   08-307147 A   11/1996
(Continued)

OTHER PUBLICATIONS

WO2019116927 Machine Translation via WIPO (Year: 2019).*
JP2018-195766 Machine Translation via EPO (Year: 2018).*

*Primary Examiner* — Laura C Powers
(74) *Attorney, Agent, or Firm* — Volpe Koenig

(57) ABSTRACT

A wiring board includes an insulating layer comprising organic resin with inorganic particles, a first metal layer on a first surface, and a second metal layer disposed on a second surface. The insulating layer has a thickness of 75-1000 μm and a storage modulus of 4 GPa-7 GPa. The first metal layer has a thickness of 1.5-10 μm and a coverage of 5%-25%. The second metal layer has a thickness of 3-10 μm or 25-100 μm and a coverage of 85% or more. A surface part of the insulating layer on the first metal layer side has a higher ratio of organic resin than a surface part of the insulating layer on the second metal layer side.

5 Claims, 10 Drawing Sheets

(51) Int. Cl.
*H01Q 13/08* (2006.01)
*H05K 1/02* (2006.01)
*H05K 1/16* (2006.01)
*H05K 1/11* (2006.01)

(52) U.S. Cl.
CPC ............ *H05K 1/0271* (2013.01); *H05K 1/16* (2013.01); *H05K 1/115* (2013.01); *H05K 2201/10098* (2013.01)

(56) References Cited

U.S. PATENT DOCUMENTS

| | | | |
|---|---|---|---|
| 2013/0134227 A1* | 5/2013 | De Maquille | G06K 19/07722 29/601 |
| 2019/0089044 A1* | 3/2019 | Kobuke | H01L 21/4807 |
| 2020/0128667 A1* | 4/2020 | Nagasawa | B32B 27/18 |

FOREIGN PATENT DOCUMENTS

| | | | | |
|---|---|---|---|---|
| JP | 2001-111328 A | | 4/2001 | |
| JP | 2003-037420 A | | 2/2003 | |
| JP | 2015-084394 A | | 4/2015 | |
| JP | 2017-187379 A | | 10/2017 | |
| JP | 2018195766 A | * | 12/2018 | |
| WO | 2005/013418 A1 | | 2/2005 | |
| WO | WO-2019116927 A1 | * | 6/2019 | ............ B32B 15/08 |

* cited by examiner

WIRING BOARD

TECHNICAL FIELD

The present disclosure relates to a wiring board.

BACKGROUND

In the automotive industry, a millimeter wave radar has been rapidly spreading in recent years for purposes such as collision prevention. A transmission line for transmitting high-frequency signals is required to be compact and have low transmission loss. Examples of such a transmission line include strip lines, microstrip lines, and coplanar lines. Among these transmission lines, for example, a microstrip line is composed of a rectangular-shaped patch conductor on one main surface of an insulation layer and a ground (earth) conductor on an opposite main surface. In order to suppress the attenuation of transmission signals due to dielectric loss, such a transmission line requires an insulating layer having a low relative permittivity and a low dielectric dissipation factor. For example, an insulating layer mainly composed of organic resin such as Teflon (registered trademark) can be mentioned (see Patent Documents 1, 2 and 3).

PRIOR ART DOCUMENTS

Patent Documents

Patent Document 1: Japanese Unexamined Patent Publication No. 2017-187379
Patent Document 2: Japanese Unexamined Patent Publication No. 2003-37420
Patent Document 3: International Publication No. 2005/013418

SUMMARY OF THE INVENTION

A wiring board of the present disclosure includes an insulating layer which is mainly composed of organic resin and has inorganic particles, a first metal layer which is disposed on a first surface of the insulating layer, and a second metal layer which is disposed on a second surface on an opposite side of the first surface, in which
the insulating layer has
a thickness of 75 μm or more and 1000 μm or less,
a storage modulus of 4 GPa or more and 7 GPa or less,
the first metal layer has
a thickness of 1.5 μm or more and 10 μm or less,
a coverage of 5% or more and 25% or less,
the second metal layer has
a thickness of 3 μm or more and 10 μm or less or 25 μm or more and 100 μm or less,
a coverage of 85% or more, and
a surface part of the insulating layer on a side where the first metal layer is provided has a higher ratio of organic resin than a surface part of the insulating layer on a side where the second metal layer is provided.

EMBODIMENTS FOR CARRYING OUT THE INVENTION

Organic resin that configures the conventional wiring board described above originally has a low storage modulus. Therefore, depending on the size and placement of the rectangular-shaped patch conductor and the ground (earth) conductor provided on both main surfaces of the insulating layer, the wiring board tends to warp. The present disclosure aims to address this problem and to obtain a wiring board that can reduce warpage.

Figure 1:
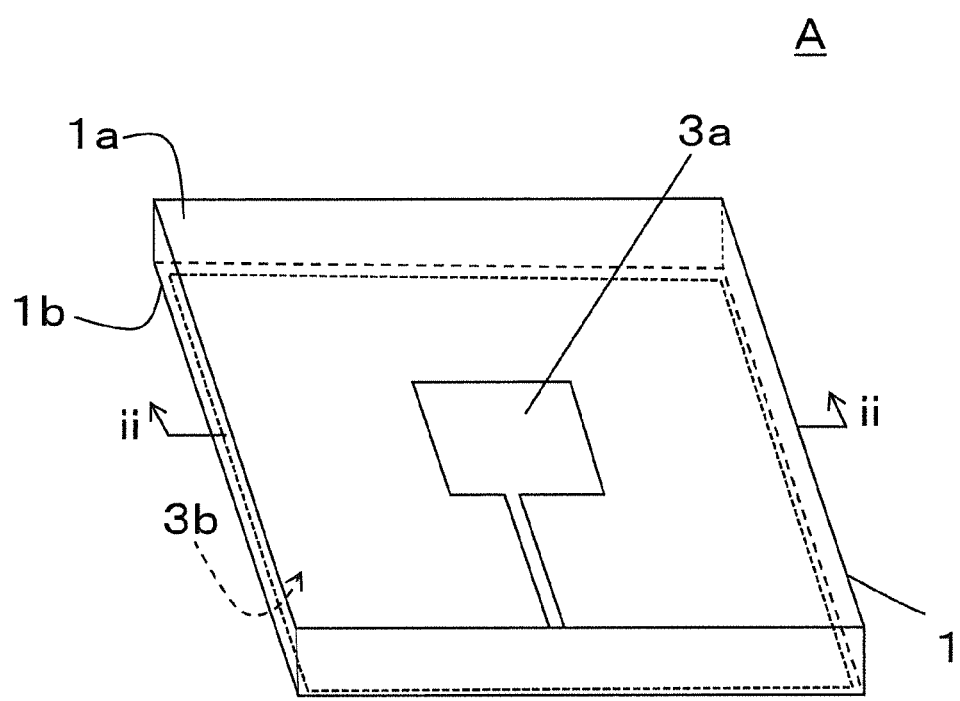
FIG. 1 is a perspective view of a wiring board according to one embodiment of the present disclosure.
Figure 2:
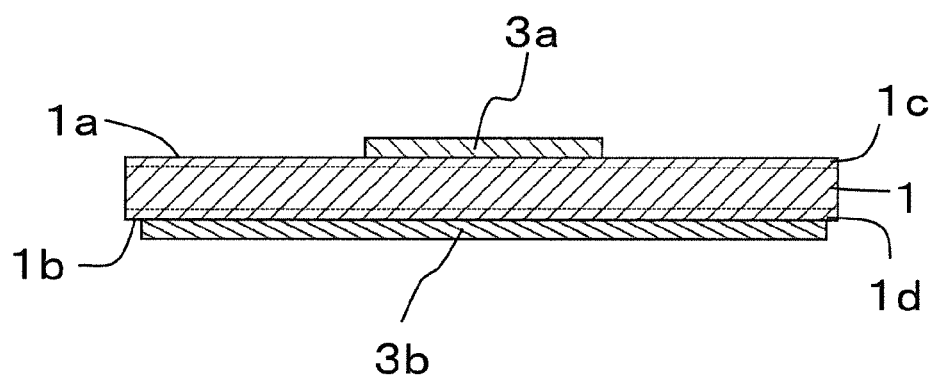
FIG. 2 is a sectional view of line ii-ii in FIG. 1.

FIG. 1 is a perspective view of a wiring board according to one embodiment of the present disclosure. FIG. 2 is a sectional view of line ii-ii in FIG. 1. A wiring board A of the present disclosure includes a first metal layer 3a which is disposed on a first surface 1a of an insulating layer 1, and a second metal layer 3b which is disposed on a second surface 1b on an opposite side of the first surface 1a. The insulating layer 1 is mainly composed of organic resin and includes inorganic particles.

In the present disclosure, the wiring board A having small warpage can be obtained if the insulating layer 1, the first metal layer 3a, and the second metal layer 3b satisfy the following conditions. In this case, the value of warpage is satisfied immediately after the wiring board A is manufactured as well as after the wiring board A is exposed to the conditions of general reliability tests.

As for the conditions of each member that configures the wiring board A, the insulating layer 1 has a thickness of 75 μm or more and 1000 μm or less, and a storage modulus of 4 GPa or more and 7 GPa or less. The first metal layer 3a has a thickness of 1.5 μm or more and 10 μm or less, and a coverage of 5% or more and 25% or less. Here, the coverage is an area ratio of the first metal layer 3a to the first surface 1a of the insulating layer 1. The second metal layer 3b has a thickness of 3 μm or more and 10 μm or less or 25 μm or more and 100 μm or less, and a coverage of 85% or more. In this case, the coverage is an area ratio of the second metal layer 3b to the second surface 1b of the insulating layer 1.

Furthermore, in the wiring board A, a surface part 1c of the insulating layer 1 on a side where the first metal layer 3a is provided has a higher ratio of organic resin than a surface part 1d of the insulating layer 1 on a side where the second metal layer 3b is provided.

In addition to the conditions of the thickness and the coverage of the first metal layer 3a and the second metal layer 3b which are respectively provided on the first surface 1a and the second surface 1b of the insulating layer 1, when the ratio of organic resin is different on both sides of the insulating layer 1, the warpage of the wiring board A can be reduced by disposing a metal layer having a low coverage on the surface part 1c where the ratio of organic resin is high. As an example of the level of warpage, if the area of a plane of the wiring board A is 50 mm×50 mm, the warpage is 2 mm or less. The warpage of the wiring board A is the average of the maximum values when the warpage is measured by scanning on two intersecting diagonal lines if the wiring board A is rectangular in shape. A three-dimensional laser displacement meter, for example, is used to measure the warpage.

Organic resin as a main component means a state in which a volume ratio of organic resin is the highest in the insulating layer 1. As for inorganic particles, among various inorganic particles, particulate silica is suitable due to its low relative permittivity. In this case, the thermal expansion coefficient of organic resin is preferably higher than the thermal expansion coefficient of inorganic particles. Copper is also suitable as a material for the first metal layer 3a and the second metal layer 3b. Copper is suitable because it has relatively low electrical resistance, and for example, it can be formed by plating films in addition to the method of transferring metal foils, and furthermore, it is inexpensive. The surface parts 1c and 1d of the insulating layer 1 are set to a depth of up to 10 µm from the surface. The ratio of inorganic particles in the surface parts 1c and 1d of the insulating layer 1 is determined by observing a cross-section of the prepared wiring board A using a scanning electron microscope having an analyzer, and from the area ratio of inorganic particles in a unit area region of a cross-sectional photograph taken. The ratio of organic resin is calculated by subtracting the area ratio of inorganic particles from the unit area of the cross-sectional photograph taken.

Figure 3:
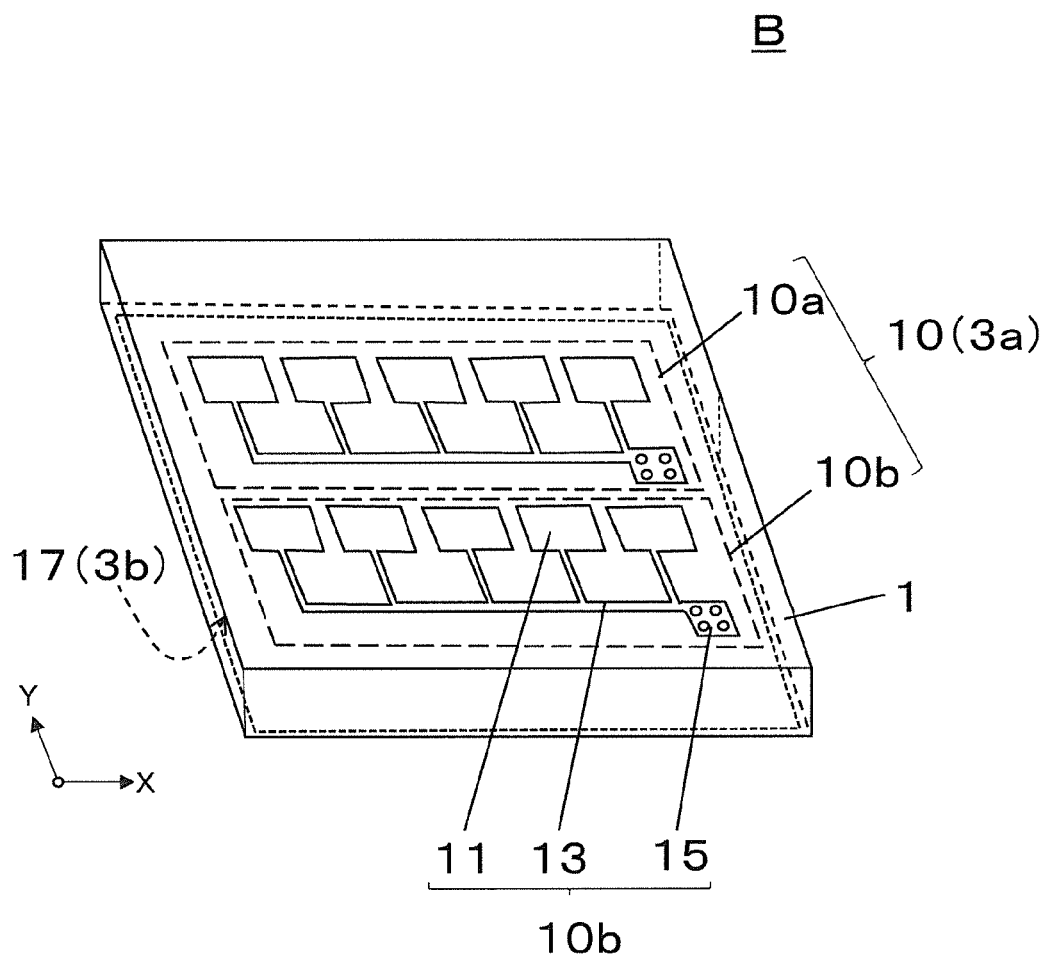
FIG. 3 is a perspective view illustrating another embodiment of a wiring board of the present disclosure.

FIG. 3 is a perspective view illustrating another embodiment of a wiring board of the present disclosure. A wiring board B illustrated in FIG. 3 includes an antenna pattern 10 of microstrip type as the first metal layer 3a. The antenna pattern 10 includes a patch conductor 11, a linear conductor 13, and a power supply part 15. The second metal layer 3b is a ground conductor 17.

The antenna pattern 10 in the wiring board B illustrated in FIG. 3 is in the form of a plurality of patch conductors 11 connected in parallel to the linear conductor 13. The power supply part 15 is provided at an end part of the linear conductor 13. The wiring board B includes two antenna patterns 10a and 10b on a main surface 1a of the insulating layer 1. In this case, the areas of the two antenna patterns 10a and 10b are equal in the ratio to the area of the first surface 1a of the insulating layer 1. Equal in the area ratio is defined as when the area between two antenna patterns 10a and 10b is within 10 points in % display difference. The two antenna patterns 10a and 10b illustrated in FIG. 3 have a longitudinal direction of the antenna pattern 10 (10a and 10b) facing an X direction on the first surface 1a. The two antenna patterns 10a and 10b are aligned in the direction perpendicular to the longitudinal direction (a Y direction).

Figure 4:
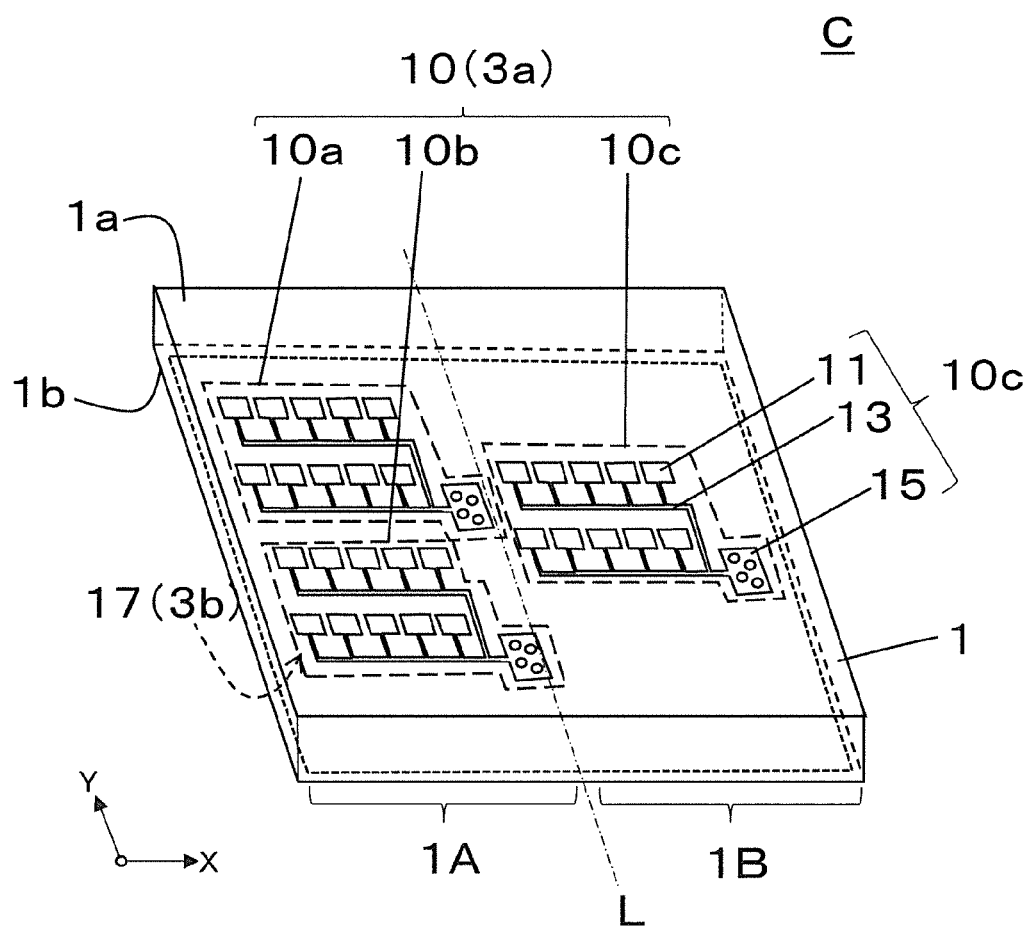
FIG. 4 is a perspective view illustrating another embodiment of a wiring board of the present disclosure.

FIG. 4 is a perspective view illustrating another embodiment of a wiring board of the present disclosure. A wiring board C illustrated in FIG. 4 includes three antenna patterns 10a, 10b, and 10c on the first surface 1a of the insulating layer 1. The antenna pattern 10 includes the patch conductor 11, the linear conductor 13, and the power supply part 15. The second metal layer 3b is the ground conductor 17. The antenna patterns 10a, 10b, and 10c have the linear conductor 13 branched into two. A plurality of patch conductors 11 are connected in parallel to each of the branched linear conductors 13. In this case, the area of the three antenna patterns 10a, 10b, and 10c is also within 10 points in % display difference between the three antenna patterns 10a, 10b, and 10c, as in the case of the wiring board B described above.

In the wiring board C, two antenna patterns 10a and 10b out of three antenna patterns 10a, 10b, and 10c are disposed so as to be aligned in the Y direction on the first surface 1a. The other antenna pattern 10c is disposed at a distance in the X direction from the two antenna patterns 10a and 10b. The placement is non-linearly symmetrical in at least one direction when the direction of the plane at the first surface 1a of the insulating layer 1 is the X direction and the Y direction, which are perpendicular to each other.

More details are explained. First, the first surface 1a of the wiring board C has a rectangular shape. A virtual line L is set on the first surface 1a. The virtual line L faces a direction perpendicular to one side of the first surface 1a. The virtual line L is drawn to pass through the center of the first surface 1a. The region on the left side of the wiring board C (the insulating layer 1) is 1A, and the region on the right side is 1B. Two antenna patterns 10a and 10b out of three antenna patterns 10a, 10b, and 10c are disposed in the region 1A on the left side. On the other hand, one antenna pattern 10c is disposed in the region 1B on the right side. The number of antenna patterns 10 differs between the region 1A on the left and the region 1B on the right. The antenna patterns 10a and 10b and the antenna pattern 10c are disposed in a non-linear symmetry with respect to the virtual line L. In other words, the area of the antenna pattern 10 (10a, 10b) or the area ratio of the antenna pattern 10 to the area of the first surface 1a of the insulating layer 1 is different between the region 1A on the left side and the region 1B on the right side of the wiring board C.

The present disclosure can reduce the warpage of the wiring board C even if the antenna pattern 10 is not evenly disposed on the first surface 1c of the wiring board C, as illustrated in FIG. 4 using the wiring board C as an example. As a result, the degradation of antenna characteristics can be reduced.

Figure 5:
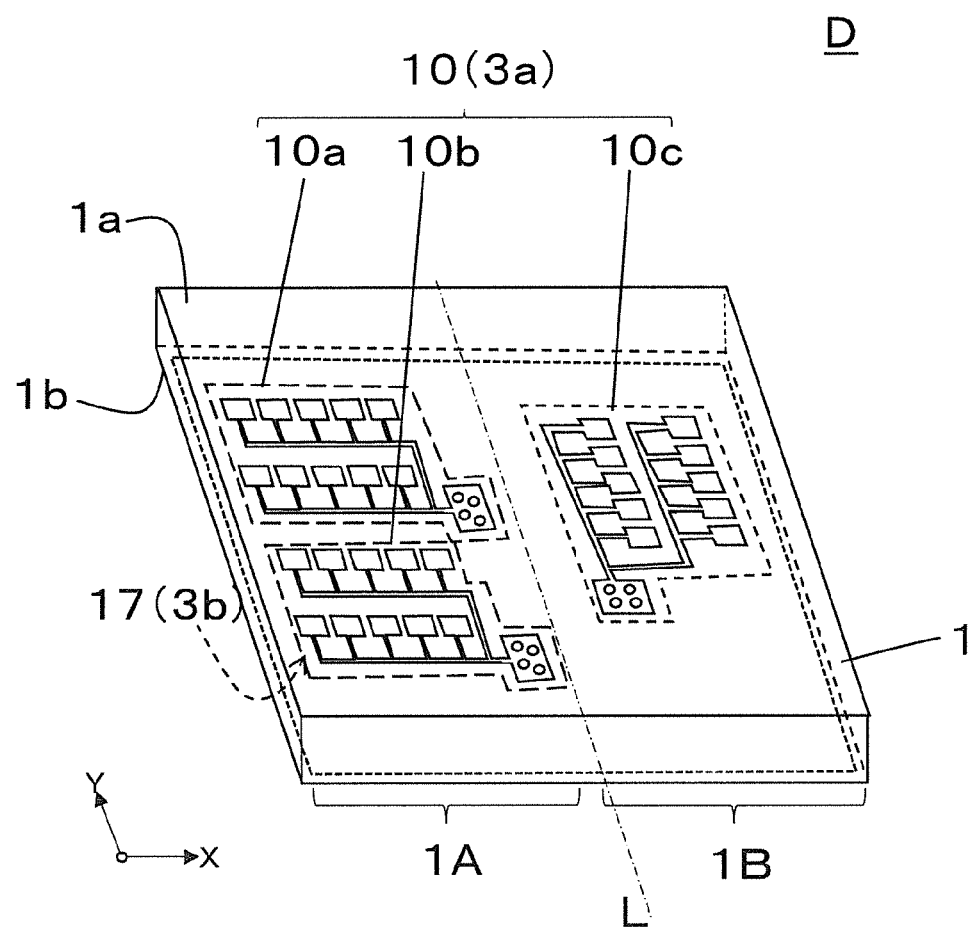
FIG. 5 is a perspective view illustrating another embodiment of a wiring board of the present disclosure.

FIG. 5 is a perspective view illustrating another embodiment of a wiring board of the present disclosure. The wiring board D illustrated in FIG. 5 has a 90° rotated orientation of one antenna pattern (in this case, the antenna pattern of reference numeral 10c) among a plurality of antenna patterns 10a, 10b, and 10c disposed with respect to the wiring board C illustrated in FIG. 4. The longitudinal direction of the linear conductor 13 forming the antenna pattern 10c in the wiring board C illustrated in FIG. 4 is in the X direction. In contrast, in the wiring board D illustrated in FIG. 5, the longitudinal direction of the linear conductor 13 forming the antenna pattern 10c is in the Y direction. That is, in the wiring board D illustrated in FIG. 5, when a plurality of antenna patterns 10 are disposed on the insulating layer 1, at least one of the antenna patterns (in this case, reference numeral 10c) is disposed to face a different direction from the other antenna patterns 10. The present disclosure can reduce the warpage of the wiring board even if a plurality of antenna patterns 10 are formed on the insulating layer 1 and at least one of the antenna patterns 10 (in this case, reference numeral 10c) is disposed to face a different direction from the other antenna patterns 10. In this case, the ratio of the antenna patterns 10 that are disposed in a different direction from the other antenna patterns 10 among the plurality of antenna patterns 10 formed on the insulating layer 1 is preferably within a range of 20% or more and 45% or less when the total area of the antenna patterns is 100%.

In the wiring boards C and D, if the first surface 1a is a rectangular shape, and a virtual line L is set at a right angle to one side of the first surface 1a and at the center of the first surface 1a, the plurality of antenna patterns 10a, 10b, 10c differ in at least one of number, area, and orientation between the two regions 1A and 1B across the virtual line L.

Figure 6:
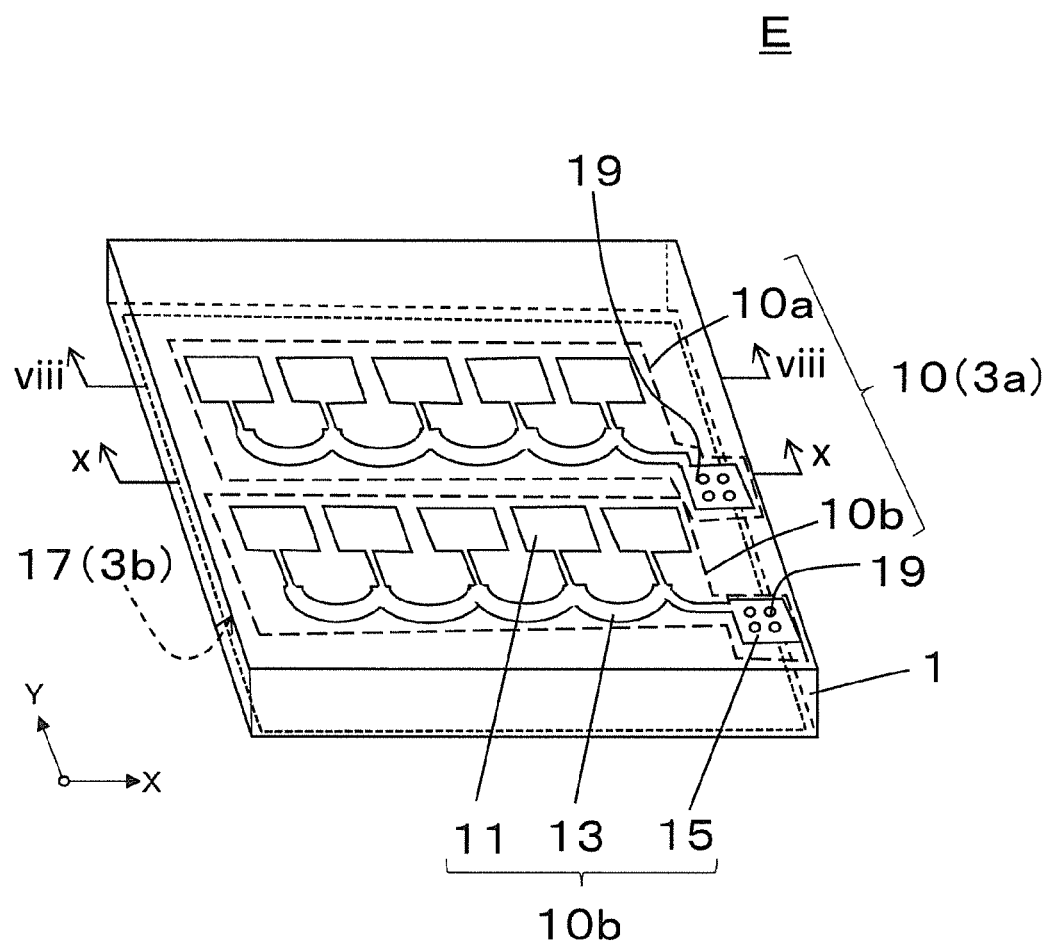
FIG. 6 is a perspective view illustrating another embodiment of a wiring board of the present disclosure.

FIG. 6 is a perspective view further illustrating another embodiment of a wiring board of the present disclosure. A wiring board E is illustrated in FIG. 6. The antenna pattern 10 which is provided in the wiring board E is a basic shape of the antenna pattern 10 in the wiring board B illustrated in FIG. 3, and the shape of the linear conductor 13 is changed.

A wiring conductor E illustrated in FIG. 6 is a planar curved shape of the linear conductor 13 in the antenna pattern 10. If the linear conductor 13 has such a curved shape, it is possible to dispose more patch conductors 3a between adjacent linear conductors 13 even if the area of the first surface 1a is limited.

If the linear conductor 13 has a curved shape, the intervals between the patch conductors 13 can be adjusted. This makes it possible to reduce phase shifts of the radio waves radiated respectively from a plurality of patch conductors 13.

If the linear conductor 13 is bent at a right angle like the wiring boards B, C, and D, an electric field tends to radiate into space from a part that is bent at a right angle when supplying the electric field from the power supply part 15 to the patch conductor 13.

On the other hand, if the linear conductor 13 has a curved shape, the electric field can be suppressed from radiating into space. As a result, the radiation characteristics from the antenna pattern 10 can be enhanced.

Figure 7:
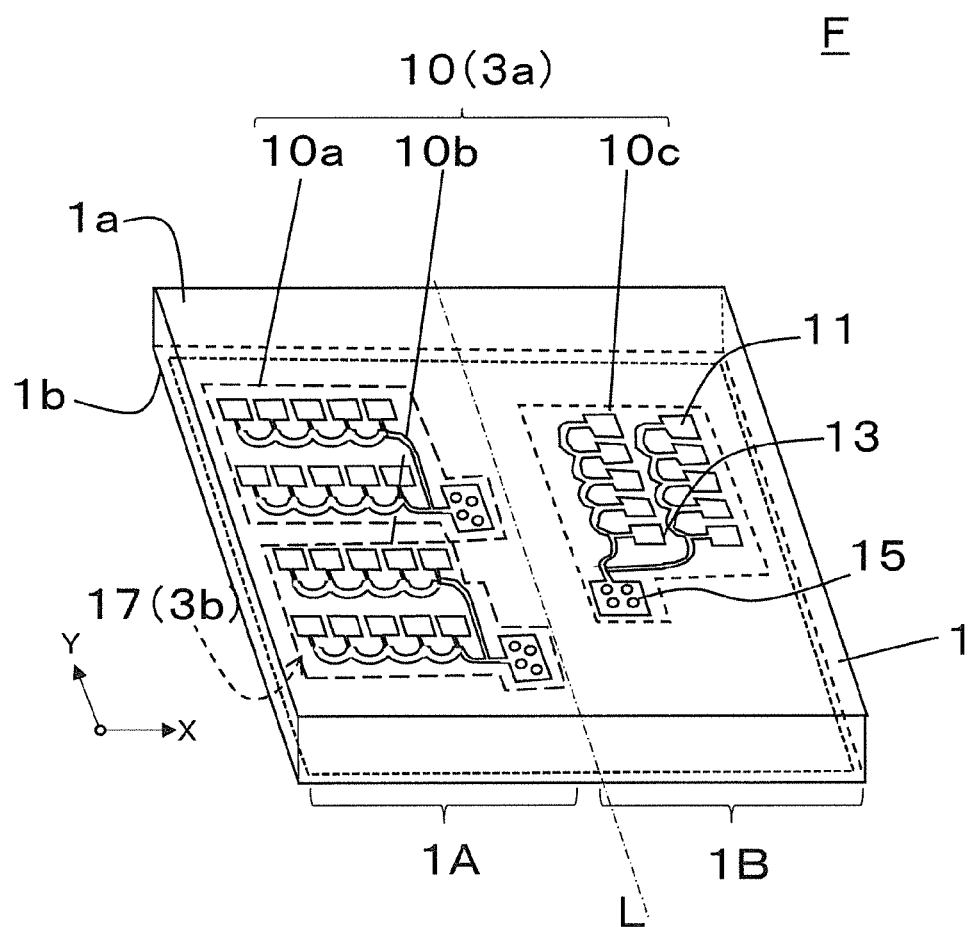
FIG. 7 is a perspective view illustrating another embodiment of a wiring board of the present disclosure.

FIG. 7 is a perspective view illustrating another embodiment of a wiring board of the present disclosure. A wiring board F illustrated in FIG. 7 has a basic shape of the antenna pattern 10 in the wiring board D illustrated in FIG. 5, and the shape of the linear conductor 13 is changed.

For the wiring board F illustrated in FIG. 7, the linear conductor 13 is a curved shape, similar to the wiring board E illustrated in FIG. 6. The wiring board F also has a shape that is able to adjust the intervals between the patch conductors 13. This makes it possible to reduce phase shifts of the radio waves radiated respectively from a plurality of patch conductors 13. In addition, the electric field can be suppressed from radiating into space because the linear conductor 13 has a curved shape. Compared to the wiring board E, the wiring board F can enhance the radiation characteristics from the antenna pattern 10.

Figure 8:
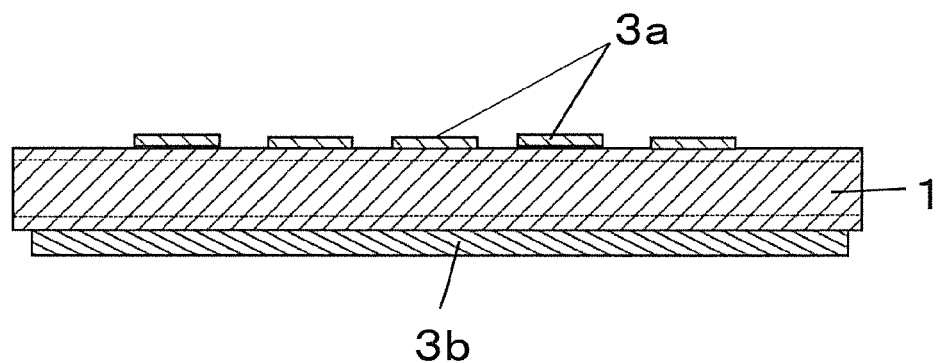
FIG. 8 is a sectional view of line viii-viii in FIG. 6.
Figure 9:
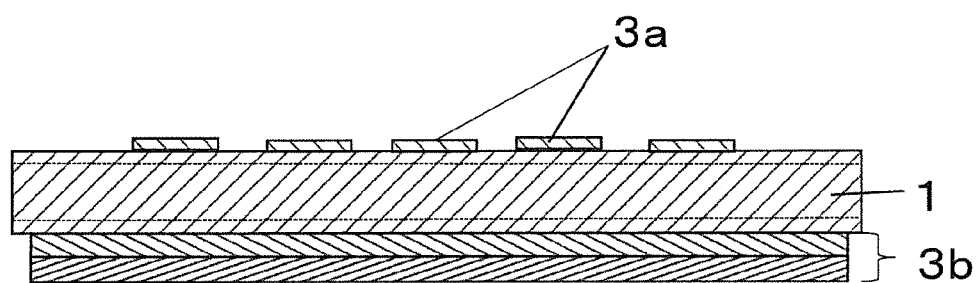
FIG. 9 is a sectional view illustrating another embodiment of a wiring board of the present disclosure.

FIG. 8 is a sectional view of line viii-viii in FIG. 6. FIG. 9 is a sectional view illustrating another embodiment of a wiring board of the present disclosure. A wiring board G illustrated in FIG. 9 is a sectional view illustrating a state in which the second metal layer 3b is layered in the thickness direction to the wiring board E illustrated in FIGS. 6 and 8.

In the wiring board E illustrated in FIGS. 6 and 8, the second metal layer 3b, which is the ground conductor 17, is a single-layered structure. In contrast, in the wiring board G illustrated in a sectional view in FIG. 9, the second metal layer 3b, which is the ground conductor 17, is layered in the thickness direction. In this case, the second metal layer 3b has a structure through an interface. Whether the second metal layer 3b is layered or not is determined by microscopic observation such as a scanning electron microscope. In this case, the thickness of the second metal layer 3b is preferably 25 μm or more and 100 μm or less, especially 25 μm or more and 50 μm or less.

The second metal layer 3b, which forms the ground conductor 17, occupies a large area relative to the second surface 1b of the insulating layer 1. If the second metal layer 3b has a structure that forms a layer, the second metal layer 3b tends to shear and deform at this interface because the bond in the thickness direction is weaker compared to the case where the second metal layer 3b is layered. As a result, the wiring board G exhibits high flexibility. It is also difficult for cracks to occur on the surface of the wiring board F even if the wiring board F is bent.

Figure 10:
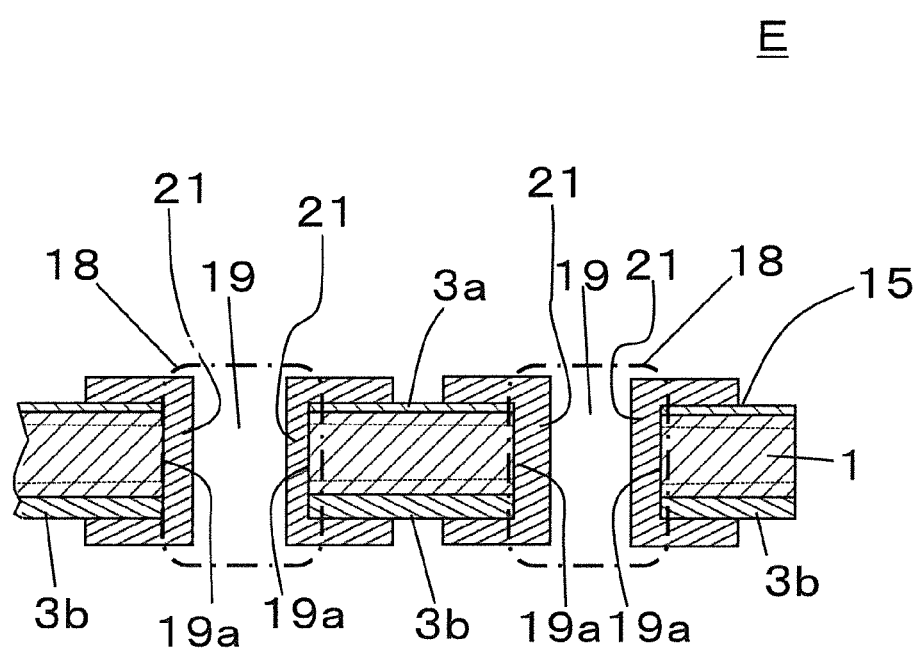
FIG. 10 is a partial sectional view in line x-x in FIG. 6.

FIG. 10 is a partial sectional view in line x-x in FIG. 6. FIG. 10 is a partial sectional view of the power supply part 15 of the wiring board E illustrated in FIG. 6. As illustrated in FIG. 10, in the wiring board E, the power supply part 15, which is composed of the antenna pattern 10, includes a through-via 18 that penetrates the wiring board E in the thickness direction. In FIG. 10, the through-via 18 is areas surrounded by dashed-dotted lines. The through-via 18 is composed of a through-hole and a metal film. Hereinafter, the metal film provided on an inner wall 19a where the insulating layer 1 is exposed is referred to as a third metal layer 21. The third metal layer 21 plays a role as a via conductor in the wiring board E. That is, the through-via 18 includes the third metal layer 21 on the inner wall 19a where the insulating layer 1 is exposed. As illustrated in FIG. 10, the through-via 18 does not fill a through-hole 19 when viewing the wiring board E in cross-section, but partially leaves a structure that is penetrated. In this case, the third metal layer 21 is disposed so as to extend from the inner wall 19a of the through-hole 19 to the surface of the insulating layer 1. In other words, the third metal layer 21 is formed on the insulating layer so as to form a layer with the first metal layer 3a and the second metal layer 3b, without filling the through-hole 19.

The wiring board E has a structure in which the third metal layer 21, which plays a role as a conductor part of the through-via 18, does not fill the through-hole 19, but extends from the inner wall 19a of the through-hole 19 onto the respective surfaces of the first metal layer 3a and the second metal layer 3b. In other words, because the third metal layer 21 is a layered structure with the first metal layer 3a or the second metal layer 3b, the bond between the layers is weaker than that of a structure in which the third metal layer 21 and the first metal layer 3a or the second metal layer 3b are integrated. Therefore, the third metal layer 21 also tends to shear and deform respectively at the interface with the first metal layer 3a and the interface with the second metal layer 3b. As a result, even though the wiring board E has the through-via 18, it exhibits high flexibility, and it is difficult for cracks to occur on the surface of the wiring board E when the wiring board E is bent. Although the wiring board E illustrated in FIG. 6 is shown as an example of a wiring board having the third metal layer 21, the present disclosure is not limited to this, and it is needless to say that similar effects can be obtained for the wiring boards B, C, D, F, and G.

Organic resin included in the insulating layer 1 that configures the wiring boards (A to G) of the disclosure can be applied as suitable if it is an organic material having low relative permittivity and dielectric dissipation factor. In this case, thermosetting organic resin is preferred. As an example of organic resin, one from the group of cyclic olefin copolymer, polyphenylene ether, and polytetrafluoroethylene is preferred.

Inorganic particles may be 5% or more and 50% or less by a volume ratio in the insulating layer 1. Besides this, auxiliaries such as flame retardants and stress relievers may also be included. The ratio of these auxiliaries is preferably 2% or more and 20% or less by volume, respectively, in the insulating layer 1.

The wiring boards A to G can be obtained, for example, through the steps of: preparing a resin composition that becomes the above-mentioned insulating layer 1, forming a semi-cured insulating sheet by forming this resin composition into a sheet shape, attaching metal foils that become the first metal layer and the second metal layer to the surface of this insulating sheet, heating and pressurizing the insulating sheet on which the first metal layer and the second metal layer are formed under predetermined conditions (temperature, pressure, and atmosphere), and etching the metal foils into predetermined patterns. After this, if necessary, through-holes are formed in the wiring boards A to F using a mold or laser processing machine. The third metal layer 21, which becomes the through-via 18 by plating the through hole 19, is also formed.

If the second metal layer 3b is layered, it is preferable to set the plating speed to a faster condition than usual when forming a metal layer on the outermost surface side of the second metal layer 3b. This also applies to the case where the third metal layer 21 is formed in layers on the first metal layer 3a and the second metal layer 3b. In this case, it is needless to say that usual conditions for cleaning, degreasing, reducing or the like are applied to the surface of the metal film to be plated.

EXAMPLES

First, a sheet-like molded body was prepared. For the sheet-like molded body, cyclic olefin copolymer modified to thermosetting type was used as organic resin. Silica (specific gravity: 2) was used as inorganic particles. "SAYTEX8010 (manufactured by Albemarle Corporation)" (specific gravity: 2.8) was used as flame retardant. Inorganic particles were added at a rate of 20 mass parts per 100 mass parts of organic resin. Flame retardant was added at a rate of 30 mass parts per 100 mass parts of organic resin.

Next, the resulting resin composition was dissolved in xylene to obtain resin varnish. The mass ratio of the resin composition to xylene was 40:60. The resulting resin varnish was then formed into a sheet using a bar coater and dried at 150° C. The drying time was varied from 3 to 60 minutes depending on the thickness of the sheet-like molded body to obtain a sheet-like molded body in a semi-cured state.

Next, a copper clad laminate was obtained by attaching copper foils to both main surfaces of the sheet-like molded body in the semi-cured state and performing pressurizing and heating treatment. The resulting copper clad laminate was then subjected to resist processing and etching to form the antenna pattern. The area of a plane of the wiring board is 50 mm×50 mm. When forming the second metal layer in a two-layer structure, the second metal layer was plated at twice the speed of the plating when preparing a wiring board having a one-layer structure. Plating was carried out at 3 A/dm$^2$ for 50 minutes.

The ratio of organic resin and inorganic particles in the surface part of the insulating layer was determined by observing a cross-section of the prepared wiring board using a scanning electron microscope having an analyzer, and from the area ratio of inorganic particles in the unit area region of the cross-sectional photographs taken. The area where the cross-sectional photographs were taken was 10 μm in depth and 50 μm in width from the surface. For each sample, the cross-sectional photographs of the center part of both main surfaces were taken at one location, respectively.

For the storage modulus, the metal foil was peeled off from the resulting wiring board, the insulating layer was processed to 50 mm (length)×8 mm (width), and the dynamic mechanical analysis (DMA) was performed to obtain a value at room temperature (25° C.)

Among the evaluation items listed in the table, the antenna pattern illustrated in FIG. 1 was used to measure the warpage and flexibility of the wiring board. FIG. 1 is a structure in which the first metal layer and the second metal layer are respectively disposed at the center of both main surfaces of the insulating layer.

The warpage of the wiring board was measured using a 3D laser displacement meter to the copper clad laminate obtained after pressurizing and heating treatment. In this case, the surface of the first metal layer side of the wiring board was measured along two intersecting diagonal lines. The number of samples was five, and the average value was calculated.

For the flexibility of the wiring board, the resulting wiring board was cut to prepare a sample (2 mm×20 mm). Stainless steel (SUS304) rods having diameters of 3 mm, 3.5 mm, 4 mm, and 4.5 mm were prepared, and the resulting samples were placed on each rod and bent 180°. The presence of cracks was checked by visually observing the bent parts. The minimum diameters of the rods where cracks occurred are shown in Tables 1 to 3. It was determined that it had superior flexibility when it was 4 mm or less. In Tables 1 to 3, only the values of the samples for which the flexibility was measured are given.

The antenna characteristics were evaluated by measuring the radiation characteristics and the gain using a network analyzer for the samples shown in Tables 12 to 14. In this case, the value of the sample having the maximum value of gain was normalized to 1 for each antenna pattern having a similar shape, as shown in Tables 12 to 14, respectively. For the samples that evaluated the antenna characteristics shown in Tables 12 to 14, the wiring board, in which the thickness of the insulating layer was 100 μm, the storage modulus was 5 GPa, the coverage of the first metal layer was 17%, the coverage of the second metal layer was 95%, and the thickness was 50 μm, and the first metal layer was formed on the surface of the side with a high ratio of organic resin in the insulating layer, was used. The samples with varying thickness of the first metal layer and number of layers of the second metal layer were used. The warpage of the wiring board was also measured for each sample after the antenna characteristics were measured.

TABLE 1

| Sample No. | Insulating Layer Thickness μm | Insulating Layer Young's Modulus GPa | First Metal Layer Coverage % | First Metal Layer Thickness μm | Second Metal Layer Coverage % | Second Metal Layer Thickness μm | Number of Layers | Metal Layer on a Surface with a High Ratio of Organic Resin | Total Thickness μm | Warpage mm |
|---|---|---|---|---|---|---|---|---|---|---|
| I-1 | 100 | 5 | 3 | 1.5 | 85 | 3 | 1 | First Metal Layer | 104.5 | 4 |
| I-2 | 100 | 5 | 30 | 1.5 | 85 | 3 | 1 | First Metal Layer | 104.5 | 4 |
| I-3 | 100 | 5 | 3 | 5 | 85 | 3 | 1 | First Metal Layer | 108 | 4 |
| I-4 | 100 | 5 | 30 | 5 | 85 | 3 | 1 | First Metal Layer | 108 | 4 |

TABLE 1-continued

| Sample No. | Insulating Layer Thickness μm | Young's Modulus GPa | First Metal Layer Coverage % | Thickness μm | Second Metal Layer Coverage % | Thickness μm | Number of Layers | Metal Layer on a Surface with a High Ratio of Organic Resin | Total Thickness μm | Warpage mm |
|---|---|---|---|---|---|---|---|---|---|---|
| I- 5  | 100 | 5 | 3  | 10  | 85 | 3   | 1 | First Metal Layer | 113   | 4 |
| I- 6  | 100 | 5 | 30 | 10  | 85 | 3   | 1 | First Metal Layer | 113   | 4 |
| I- 7  | 100 | 5 | 3  | 1.5 | 95 | 3   | 1 | First Metal Layer | 104.5 | 4 |
| I- 8  | 100 | 5 | 30 | 1.5 | 95 | 3   | 1 | First Metal Layer | 104.5 | 4 |
| I- 9  | 100 | 5 | 3  | 1.5 | 99 | 3   | 1 | First Metal Layer | 104.5 | 4 |
| I- 10 | 100 | 5 | 30 | 1.5 | 99 | 3   | 1 | First Metal Layer | 104.5 | 4 |
| I- 11 | 100 | 5 | 5  | 1   | 85 | 3   | 1 | First Metal Layer | 104   | 5 |
| I- 12 | 100 | 5 | 25 | 13  | 85 | 3   | 1 | First Metal Layer | 116   | 4 |
| I- 13 | 100 | 5 | 17 | 1   | 85 | 3   | 1 | First Metal Layer | 104   | 5 |
| I- 14 | 100 | 5 | 17 | 13  | 85 | 3   | 1 | First Metal Layer | 116   | 4 |
| I- 15 | 100 | 5 | 5  | 1   | 95 | 3   | 1 | First Metal Layer | 104   | 5 |
| I- 16 | 100 | 5 | 25 | 13  | 95 | 3   | 1 | First Metal Layer | 116   | 4 |
| I- 17 | 100 | 5 | 17 | 1   | 95 | 3   | 1 | First Metal Layer | 104   | 5 |
| I- 18 | 100 | 5 | 17 | 13  | 95 | 3   | 1 | First Metal Layer | 116   | 4 |
| I- 19 | 100 | 5 | 5  | 1   | 99 | 3   | 1 | First Metal Layer | 104   | 5 |
| I- 20 | 100 | 5 | 25 | 13  | 99 | 3   | 1 | First Metal Layer | 116   | 4 |
| I- 21 | 100 | 5 | 17 | 1   | 99 | 3   | 1 | First Metal Layer | 104   | 5 |
| I- 22 | 100 | 5 | 17 | 13  | 99 | 3   | 1 | First Metal Layer | 116   | 4 |
| I- 23 | 100 | 5 | 5  | 5   | 80 | 3   | 1 | First Metal Layer | 108   | 5 |
| I- 24 | 100 | 5 | 25 | 5   | 80 | 3   | 1 | First Metal Layer | 108   | 4 |
| I- 25 | 100 | 5 | 5  | 5   | 80 | 10  | 1 | First Metal Layer | 115   | 5 |
| I- 26 | 100 | 5 | 25 | 5   | 80 | 10  | 1 | First Metal Layer | 115   | 4 |
| I- 27 | 100 | 5 | 5  | 5   | 80 | 25  | 1 | First Metal Layer | 130   | 5 |
| I- 28 | 100 | 5 | 25 | 5   | 80 | 25  | 1 | First Metal Layer | 130   | 4 |
| I- 29 | 100 | 5 | 5  | 5   | 80 | 100 | 2 | First Metal Layer | 205   | 5 |
| I- 30 | 100 | 5 | 25 | 5   | 80 | 100 | 2 | First Metal Layer | 205   | 4 |

TABLE 2

| Sample No. | Insulating Layer Thickness μm | Young's Modulus GPa | First Metal Layer Coverage % | Thickness μm | Second Metal Layer Coverage % | Thickness μm | Number of Layers | Metal Layer on a Surface with a High Ratio of Organic Resin | Total Thickness μm | Warpage mm | Flexibility mm |
|---|---|---|---|---|---|---|---|---|---|---|---|
| I- 31 | 100 | 5 | 5  | 5   | 95 | 2   | 1 | First Metal Layer | 107   | 5 | — |
| I- 32 | 100 | 5 | 25 | 5   | 95 | 2   | 1 | First Metal Layer | 107   | 5 | — |
| I- 33 | 100 | 5 | 5  | 5   | 95 | 13  | 1 | First Metal Layer | 118   | 4 | — |
| I- 34 | 100 | 5 | 25 | 5   | 95 | 13  | 1 | First Metal Layer | 118   | 4 | — |
| I- 35 | 100 | 5 | 5  | 5   | 95 | 20  | 1 | First Metal Layer | 125   | 4 | — |
| I- 36 | 100 | 5 | 25 | 5   | 95 | 20  | 1 | First Metal Layer | 125   | 4 | — |
| I- 37 | 100 | 5 | 5  | 5   | 95 | 130 | 2 | First Metal Layer | 235   | 4 | — |
| I- 38 | 100 | 5 | 25 | 5   | 95 | 130 | 2 | First Metal Layer | 235   | 4 | — |
| I- 39 | 100 | 5 | 17 | 1.5 | 95 | 2   | 1 | First Metal Layer | 103.5 | 4 | — |
| I- 40 | 100 | 5 | 17 | 5   | 95 | 2   | 1 | First Metal Layer | 107   | 4 | — |
| I- 41 | 100 | 5 | 17 | 10  | 95 | 2   | 1 | First Metal Layer | 112   | 4 | — |
| I- 42 | 100 | 5 | 17 | 1.5 | 95 | 13  | 1 | First Metal Layer | 114.5 | 5 | — |
| I- 43 | 100 | 5 | 17 | 5   | 95 | 13  | 1 | First Metal Layer | 118   | 5 | — |
| I- 44 | 100 | 5 | 17 | 10  | 95 | 13  | 1 | First Metal Layer | 123   | 5 | — |
| I- 45 | 100 | 5 | 17 | 1.5 | 95 | 20  | 1 | First Metal Layer | 121.5 | 4 | — |
| I- 46 | 100 | 5 | 17 | 5   | 95 | 20  | 1 | First Metal Layer | 125   | 4 | — |
| I- 47 | 100 | 5 | 17 | 10  | 95 | 20  | 1 | First Metal Layer | 130   | 4 | — |
| I- 48 | 100 | 5 | 17 | 1.5 | 95 | 130 | 2 | First Metal Layer | 231.5 | 4 | — |
| I- 49 | 100 | 5 | 17 | 5   | 95 | 130 | 2 | First Metal Layer | 235   | 4 | — |
| I- 50 | 100 | 5 | 17 | 10  | 95 | 130 | 2 | First Metal Layer | 240   | 4 | — |
| I- 51 | 100 | 5 | 17 | 1   | 95 | 50  | 2 | First Metal Layer | 151   | 5 | 3.5 |
| I- 52 | 100 | 5 | 17 | 13  | 95 | 50  | 2 | First Metal Layer | 163   | 4 | 3.5 |
| I- 53 | 100 | 5 | 5  | 5   | 85 | 3   | 1 | First Metal Layer | 108   | 2 | — |
| I- 54 | 100 | 5 | 25 | 5   | 85 | 3   | 1 | First Metal Layer | 108   | 2 | — |
| I- 55 | 100 | 5 | 5  | 5   | 85 | 10  | 1 | First Metal Layer | 115   | 2 | — |
| I- 56 | 100 | 5 | 25 | 5   | 85 | 100 | 1 | First Metal Layer | 115   | 2 | — |
| I- 57 | 100 | 5 | 5  | 5   | 85 | 25  | 1 | First Metal Layer | 130   | 2 | — |
| I- 58 | 100 | 5 | 25 | 5   | 85 | 25  | 1 | First Metal Layer | 130   | 2 | — |
| I- 59 | 100 | 5 | 5  | 5   | 85 | 100 | 2 | First Metal Layer | 205   | 2 | — |
| I- 60 | 100 | 5 | 25 | 5   | 85 | 100 | 2 | First Metal Layer | 205   | 2 | — |

TABLE 3

| Sample No | Insulating Layer Thickness μm | Insulating Layer Young's Modulus Gpa | First Metal Layer Coverage % | First Metal Layer Thickness μm | Second Metal Layer Coverage % | Second Metal Layer Thickness μm | Second Metal Layer Number of Layers | Metal Layer on a Surface with a High Ratio of Organic Resin | Total Thickness μm | Warpage mm | Flexibility mm |
|---|---|---|---|---|---|---|---|---|---|---|---|
| I- 61 | 100 | 5 | 17 | 1.5 | 95 | 25 | 1 | First Metal Layer | 126.5 | 2 | — |
| I- 62 | 100 | 5 | 17 | 5 | 95 | 25 | 1 | First Metal Layer | 130 | 2 | — |
| I- 63 | 100 | 5 | 17 | 10 | 95 | 25 | 1 | First Metal Layer | 135 | 2 | 3.5 |
| I- 64 | 100 | 5 | 17 | 5 | 95 | 50 | 1 | First Metal Layer | 155 | 2 | 4 |
| I- 65 | 100 | 5 | 17 | 5 | 95 | 50 | 2 | First Metal Layer | 155 | 2 | 3.5 |
| I- 66 | 100 | 5 | 17 | 1.5 | 95 | 100 | 2 | First Metal Layer | 201.5 | 2 | — |
| I- 67 | 100 | 5 | 17 | 5 | 95 | 100 | 2 | First Metal Layer | 205 | 2 | — |
| I- 68 | 100 | 5 | 17 | 10 | 95 | 100 | 2 | First Metal Layer | 210 | 2 | — |
| I- 69 | 100 | 5 | 5 | 5 | 95 | 3 | 1 | First Metal Layer | 108 | 2 | — |
| I- 70 | 100 | 5 | 25 | 5 | 95 | 3 | 1 | First Metal Layer | 108 | 2 | — |
| I- 71 | 100 | 5 | 5 | 5 | 95 | 10 | 1 | First Metal Layer | 115 | 2 | — |
| I- 72 | 100 | 5 | 25 | 5 | 95 | 10 | 1 | First Metal Layer | 115 | 2 | — |
| I- 73 | 100 | 5 | 5 | 5 | 95 | 25 | 1 | First Metal Layer | 130 | 2 | — |
| I- 74 | 100 | 5 | 5 | 5 | 95 | 50 | 1 | First Metal Layer | 155 | 2 | 4 |
| I- 75 | 100 | 5 | 5 | 5 | 95 | 50 | 2 | First Metal Layer | 155 | 2 | 3.5 |
| I- 76 | 100 | 5 | 25 | 5 | 95 | 25 | 1 | First Metal Layer | 130 | 2 | — |
| I- 77 | 100 | 5 | 25 | 5 | 95 | 50 | 1 | First Metal Layer | 155 | 2 | 4 |
| I- 78 | 100 | 5 | 25 | 5 | 95 | 50 | 2 | First Metal Layer | 155 | 2 | 3.5 |
| I- 79 | 100 | 5 | 5 | 5 | 95 | 100 | 2 | First Metal Layer | 205 | 2 | — |
| I- 80 | 100 | 5 | 25 | 5 | 95 | 100 | 2 | First Metal Layer | 205 | 2 | — |
| I- 81 | 100 | 5 | 5 | 5 | 99 | 3 | 1 | First Metal Layer | 108 | 2 | — |
| I- 82 | 100 | 5 | 25 | 5 | 99 | 3 | 1 | First Metal Layer | 108 | 2 | — |
| I- 83 | 100 | 5 | 5 | 5 | 99 | 10 | 1 | First Metal Layer | 115 | 2 | — |
| I- 84 | 100 | 5 | 25 | 5 | 99 | 10 | 1 | First Metal Layer | 115 | 2 | — |
| I- 85 | 100 | 5 | 5 | 5 | 99 | 25 | 1 | First Metal Layer | 130 | 2 | — |
| I- 86 | 100 | 5 | 25 | 5 | 99 | 25 | 1 | First Metal Layer | 130 | 2 | — |
| I- 87 | 100 | 5 | 5 | 5 | 99 | 100 | 2 | First Metal Layer | 205 | 2 | — |
| I- 88 | 100 | 5 | 25 | 5 | 99 | 100 | 2 | First Metal Layer | 205 | 2 | — |
| I- 89 | 100 | 5 | 17 | 1.5 | 95 | 3 | 1 | First Metal Layer | 104.5 | 2 | — |
| I- 90 | 100 | 5 | 17 | 5 | 95 | 3 | 1 | First Metal Layer | 108 | 2 | — |

TABLE 4

| Sample No. | Insulating Layer Thickness μm | Insulating Layer Young's Modulus Gpa | First Metal Layer Coverage % | First Metal Layer Thickness μm | Second Metal Layer Coverage % | Second Metal Layer Thickness μm | Second Metal Layer Number of Layers | Metal Layer on a Surface with a High Ratio of Organic Resin | Total Thickness μm | Warpage mm |
|---|---|---|---|---|---|---|---|---|---|---|
| I- 91 | 100 | 5 | 17 | 10 | 95 | 3 | 1 | First Metal Layer | 113 | 2 |
| I- 92 | 100 | 5 | 17 | 5 | 95 | 5 | 1 | First Metal Layer | 110 | 2 |
| I- 93 | 100 | 5 | 17 | 1.5 | 95 | 10 | 1 | First Metal Layer | 111.5 | 2 |
| I- 94 | 100 | 5 | 17 | 5 | 95 | 10 | 1 | First Metal Layer | 115 | 2 |
| I- 95 | 100 | 5 | 17 | 10 | 95 | 10 | 1 | First Metal Layer | 120 | 2 |
| I- 96 | 100 | 5 | 17 | 10 | 95 | 20 | 1 | First Metal Layer | 130 | 2 |
| I- 97 | 100 | 5 | 17 | 1.5 | 95 | 25 | 1 | First Metal Layer | 126.5 | 2 |
| I- 98 | 100 | 5 | 17 | 5 | 95 | 25 | 1 | First Metal Layer | 130 | 2 |
| I- 99 | 100 | 5 | 17 | 10 | 95 | 25 | 1 | First Metal Layer | 135 | 2 |
| I- 100 | 100 | 5 | 17 | 5 | 95 | 50 | 2 | First Metal Layer | 155 | 2 |
| I- 101 | 100 | 5 | 17 | 15 | 95 | 100 | 2 | First Metal Layer | 201.5 | 2 |
| I- 102 | 100 | 5 | 17 | 5 | 95 | 100 | 2 | First Metal Layer | 205 | 2 |
| I- 103 | 100 | 5 | 17 | 10 | 95 | 100 | 2 | First Metal Layer | 210 | 2 |
| I- 104 | 100 | 5 | 5 | 5 | 95 | 3 | 1 | First Metal Layer | 108 | 2 |
| I- 105 | 100 | 5 | 25 | 5 | 95 | 3 | 1 | First Metal Layer | 108 | 2 |
| I- 106 | 100 | 5 | 5 | 5 | 95 | 10 | 1 | First Metal Layer | 115 | 2 |
| I- 107 | 100 | 5 | 25 | 5 | 95 | 10 | 1 | First Metal Layer | 115 | 2 |
| I- 108 | 100 | 5 | 5 | 5 | 95 | 25 | 1 | First Metal Layer | 130 | 2 |
| I- 109 | 100 | 5 | 25 | 5 | 95 | 25 | 1 | First Metal Layer | 130 | 2 |
| I- 110 | 100 | 5 | 5 | 5 | 95 | 100 | 2 | First Metal Layer | 205 | 2 |
| I- 111 | 100 | 5 | 25 | 5 | 95 | 100 | 2 | First Metal Layer | 205 | 2 |
| I- 112 | 100 | 5 | 5 | 5 | 99 | 3 | 1 | First Metal Layer | 108 | 2 |
| I- 113 | 100 | 5 | 25 | 5 | 99 | 3 | 1 | First Metal Layer | 108 | 2 |
| I- 114 | 100 | 5 | 5 | 5 | 99 | 10 | 1 | First Metal Layer | 115 | 2 |
| I- 115 | 100 | 5 | 25 | 5 | 99 | 10 | 1 | First Metal Layer | 115 | 2 |
| I- 116 | 100 | 5 | 5 | 5 | 99 | 25 | 1 | First Metal Layer | 130 | 2 |
| I- 117 | 100 | 5 | 25 | 5 | 99 | 25 | 1 | First Metal Layer | 130 | 2 |

TABLE 4-continued

| | Insulating Layer | | First Metal Layer | | Second Metal Layer | | Number of Layers Layers | Metal Layer on a Surface with a High Ratio of Organic Resin | Total | |
|---|---|---|---|---|---|---|---|---|---|---|
| Sample No. | Thickness μm | Young's Modulus Gpa | Coverage % | Thickness μm | Coverage % | Thickness μm | | | Thickness μm | Warpage mm |
| I-118 | 100 | 5 | 5 | 5 | 99 | 100 | 2 | First Metal Layer | 205 | 2 |
| I-119 | 100 | 5 | 25 | 5 | 99 | 100 | 2 | First Metal Layer | 205 | 2 |
| I-120 | 75 | 5 | 5 | 5 | 85 | 3 | 1 | First Metal Layer | 83 | 2 |

TABLE 5

| | Insulating Layer | | First Metal Layer | | Second Metal Layer | | Number of Layers Layers | Metal Layer on a Surface with a High Ratio of Organic Resin | Total | |
|---|---|---|---|---|---|---|---|---|---|---|
| Sample No. | Thickness μm | Young's Modulus Gpa | Coverage % | Thickness μm | Coverage % | Thickness μm | | | Thickness μm | Warpage mm |
| I-121 | 75 | 5 | 25 | 5 | 85 | 3 | 1 | First Metal Layer | 83 | 2 |
| I-122 | 75 | 5 | 5 | 5 | 85 | 10 | 1 | First Metal Layer | 90 | 2 |
| I-123 | 75 | 5 | 25 | 5 | 85 | 10 | 1 | First Metal Layer | 90 | 2 |
| I-124 | 75 | 5 | 5 | 5 | 85 | 25 | 1 | First Metal Layer | 105 | 2 |
| I-125 | 75 | 5 | 25 | 5 | 85 | 25 | 1 | First Metal Layer | 105 | 2 |
| I-126 | 75 | 5 | 5 | 5 | 85 | 100 | 2 | First Metal Layer | 180 | 2 |
| I-127 | 75 | 5 | 25 | 5 | 85 | 100 | 2 | First Metal Layer | 180 | 2 |
| I-128 | 75 | 5 | 17 | 1.5 | 95 | 25 | 1 | First Metal Layer | 101.5 | 2 |
| I-129 | 75 | 5 | 17 | 5 | 95 | 25 | 1 | First Metal Layer | 105 | 2 |
| I-130 | 75 | 5 | 17 | 10 | 95 | 25 | 1 | First Metal Layer | 110 | 2 |
| I-131 | 75 | 5 | 17 | 5 | 95 | 50 | 2 | First Metal Layer | 130 | 2 |
| I-132 | 75 | 5 | 17 | 1.5 | 95 | 100 | 2 | First Metal Layer | 176.5 | 2 |
| I-133 | 75 | 5 | 17 | 5 | 95 | 100 | 2 | First Metal Layer | 180 | 2 |
| I-134 | 75 | 5 | 17 | 10 | 95 | 100 | 2 | First Metal Layer | 185 | 2 |
| I-135 | 75 | 5 | 5 | 5 | 95 | 3 | 1 | First Metal Layer | 83 | 2 |
| I-136 | 75 | 5 | 25 | 5 | 95 | 3 | 1 | First Metal Layer | 83 | 2 |
| I-137 | 75 | 5 | 5 | 5 | 95 | 10 | 1 | First Metal Layer | 90 | 2 |
| I-138 | 75 | 5 | 25 | 5 | 95 | 10 | 1 | First Metal Layer | 90 | 2 |
| I-139 | 75 | 5 | 5 | 5 | 95 | 25 | 1 | First Metal Layer | 105 | 2 |
| I-140 | 75 | 5 | 25 | 5 | 95 | 25 | 1 | First Metal Layer | 105 | 2 |
| I-141 | 75 | 5 | 5 | 5 | 95 | 100 | 2 | First Metal Layer | 180 | 2 |
| I-142 | 75 | 5 | 25 | 5 | 95 | 100 | 2 | First Metal Layer | 180 | 2 |
| I-143 | 75 | 5 | 5 | 5 | 99 | 3 | 1 | First Metal Layer | 83 | 2 |
| I-144 | 75 | 5 | 25 | 5 | 99 | 3 | 1 | First Metal Layer | 83 | 2 |
| I-145 | 75 | 5 | 5 | 5 | 99 | 10 | 1 | First Metal Layer | 90 | 2 |
| I-146 | 75 | 5 | 25 | 5 | 99 | 10 | 1 | First Metal Layer | 90 | 2 |
| I-147 | 75 | 5 | 5 | 5 | 99 | 25 | 1 | First Metal Layer | 105 | 2 |
| I-148 | 75 | 5 | 25 | 5 | 99 | 25 | 1 | First Metal Layer | 105 | 2 |
| I-149 | 75 | 5 | 5 | 5 | 99 | 100 | 2 | First Metal Layer | 180 | 2 |
| I-150 | 75 | 5 | 25 | 5 | 99 | 100 | 2 | First Metal Layer | 180 | 2 |

TABLE 6

| | Insulating Layer | | First Metal Layer | | Second Metal Layer | | Number of Layers Layers | Metal Layer on a Surface with a High Ratio of Organic Resin | Total | |
|---|---|---|---|---|---|---|---|---|---|---|
| Sample No. | Thickness μm | Young's Modulus Gpa | Coverage % | Thickness μm | Coverage % | Thickness μm | | | Thickness μm | Warpage mm |
| I-151 | 75 | 5 | 17 | 1.5 | 95 | 3 | 1 | First Metal Layer | 79.5 | 2 |
| I-152 | 75 | 5 | 17 | 5 | 95 | 3 | 1 | First Metal Layer | 83 | 2 |
| I-153 | 75 | 5 | 17 | 10 | 95 | 3 | 1 | First Metal Layer | 88 | 2 |
| I-154 | 75 | 5 | 17 | 5 | 95 | 5 | 1 | First Metal Layer | 85 | 2 |
| I-155 | 75 | 5 | 17 | 1.5 | 95 | 10 | 1 | First Metal Layer | 86.5 | 2 |
| I-156 | 75 | 5 | 17 | 5 | 95 | 10 | 1 | First Metal Layer | 90 | 2 |
| I-157 | 75 | 5 | 17 | 10 | 95 | 10 | 1 | First Metal Layer | 95 | 2 |
| I-158 | 75 | 5 | 17 | 10 | 95 | 20 | 1 | First Metal Layer | 105 | 2 |

TABLE 6-continued

| | Insulating Layer | | First Metal Layer | | Second Metal Layer | | | | | |
|---|---|---|---|---|---|---|---|---|---|---|
| Sample No. | Thickness μm | Young's Modulus Gpa | Coverage % | Thickness μm | Coverage % | Thickness μm | Number of Layers Layers | Metal Layer on a Surface with a High Ratio of Organic Resin | Total Thickness μm | Warpage mm |
| I-159 | 75 | 5 | 17 | 1.5 | 95 | 25 | 1 | First Metal Layer | 101.5 | 2 |
| I-160 | 75 | 5 | 17 | 5 | 95 | 25 | 1 | First Metal Layer | 105 | 2 |
| I-161 | 75 | 5 | 17 | 10 | 95 | 25 | 1 | First Metal Layer | 110 | 2 |
| I-162 | 75 | 5 | 17 | 5 | 95 | 50 | 2 | First Metal Layer | 130 | 2 |
| I-163 | 75 | 5 | 17 | 1.5 | 95 | 100 | 2 | First Metal Layer | 176.5 | 2 |
| I-164 | 75 | 5 | 17 | 5 | 95 | 100 | 2 | First Metal Layer | 180 | 2 |
| I-165 | 75 | 5 | 17 | 10 | 95 | 100 | 2 | First Metal Layer | 185 | 2 |
| I-166 | 75 | 5 | 5 | 5 | 95 | 3 | 1 | First Metal Layer | 83 | 2 |
| I-167 | 75 | 5 | 25 | 5 | 95 | 3 | 1 | First Metal Layer | 83 | 2 |
| I-168 | 75 | 5 | 5 | 5 | 95 | 10 | 1 | First Metal Layer | 90 | 2 |
| I-169 | 75 | 5 | 25 | 5 | 95 | 10 | 1 | First Metal Layer | 90 | 2 |
| I-170 | 75 | 5 | 5 | 5 | 95 | 25 | 1 | First Metal Layer | 105 | 2 |
| I-171 | 75 | 5 | 25 | 5 | 95 | 25 | 1 | First Metal Layer | 105 | 2 |
| I-172 | 75 | 5 | 5 | 5 | 95 | 100 | 2 | First Metal Layer | 180 | 2 |
| I-173 | 75 | 5 | 25 | 5 | 95 | 100 | 2 | First Metal Layer | 180 | 2 |
| I-174 | 75 | 5 | 5 | 5 | 99 | 3 | 1 | First Metal Layer | 83 | 2 |
| I-175 | 75 | 5 | 25 | 5 | 99 | 3 | 1 | First Metal Layer | 83 | 2 |
| I-175 | 75 | 5 | 5 | 5 | 99 | 10 | 1 | First Metal Layer | 90 | 2 |
| I-177 | 75 | 5 | 25 | 5 | 99 | 10 | 1 | First Metal Layer | 90 | 2 |
| I-178 | 75 | 5 | 5 | 5 | 99 | 25 | 1 | First Metal Layer | 105 | 2 |
| I-179 | 75 | 5 | 25 | 5 | 99 | 25 | 1 | First Metal Layer | 105 | 2 |
| I-180 | 75 | 5 | 5 | 5 | 99 | 100 | 2 | First Metal Layer | 180 | 2 |

TABLE 7

| | Insulating Layer | | First Metal Layer | | Second Metal Layer | | | | | |
|---|---|---|---|---|---|---|---|---|---|---|
| Sample No. | Thickness μm | Young's Modulus Gpa | Coverage % | Thickness μm | Coverage % | Thickness μm | Number of Layers Layers | Metal Layer on a Surface with a High Ratio of Organic Resin | Total Thickness μm | Warpage mm |
| I-181 | 75 | 5 | 25 | 5 | 99 | 100 | 2 | First Metal Layer | 180 | 2 |
| I-182 | 1000 | 5 | 5 | 5 | 85 | 3 | 1 | First Metal Layer | 1008 | 1 |
| I-183 | 1000 | 5 | 25 | 5 | 85 | 3 | 1 | First Metal Layer | 1008 | 1 |
| I-184 | 1000 | 5 | 5 | 5 | 85 | 10 | 1 | First Metal Layer | 1015 | 1 |
| I-185 | 1000 | 5 | 25 | 5 | 85 | 10 | 1 | First Metal Layer | 1015 | 1 |
| I-186 | 1000 | 5 | 5 | 5 | 85 | 25 | 1 | First Metal Layer | 1030 | 1 |
| I-187 | 1000 | 5 | 25 | 5 | 85 | 25 | 1 | First Metal Layer | 1030 | 1 |
| I-188 | 1000 | 5 | 5 | 5 | 85 | 100 | 2 | First Metal Layer | 1105 | 0.5 |
| I-189 | 1000 | 5 | 25 | 5 | 85 | 100 | 2 | First Metal Layer | 1105 | 0.5 |
| I-190 | 1000 | 5 | 17 | 1.5 | 95 | 25 | 1 | First Metal Layer | 1027 | 1 |
| I-191 | 1000 | 5 | 17 | 5 | 95 | 25 | 1 | First Metal Layer | 1030 | 1 |
| I-192 | 1000 | 5 | 17 | 10 | 95 | 25 | 1 | First Metal Layer | 1035 | 1 |
| I-193 | 1000 | 5 | 17 | 5 | 95 | 50 | 2 | First Metal Layer | 1055 | 1 |
| I-194 | 1000 | 5 | 17 | 1.5 | 95 | 100 | 2 | First Metal Layer | 1102 | 0.5 |
| I-195 | 1000 | 5 | 17 | 5 | 95 | 100 | 2 | First Metal Layer | 1105 | 0.5 |
| I-196 | 1000 | 5 | 17 | 10 | 95 | 100 | 2 | First Metal Layer | 1110 | 0.5 |
| I-197 | 1000 | 5 | 5 | 5 | 95 | 3 | 1 | First Metal Layer | 1008 | 1 |
| I-198 | 1000 | 5 | 25 | 5 | 95 | 3 | 1 | First Metal Layer | 1008 | 1 |
| I-199 | 1000 | 5 | 5 | 5 | 95 | 10 | 1 | First Metal Layer | 1015 | 1 |
| I-200 | 1000 | 5 | 25 | 5 | 95 | 10 | 1 | First Metal Layer | 1015 | 1 |
| I-201 | 1000 | 5 | 5 | 5 | 95 | 25 | 1 | First Metal Layer | 1030 | 3 |
| I-202 | 1000 | 5 | 25 | 5 | 95 | 25 | 1 | First Metal Layer | 1030 | 1 |
| I-203 | 1000 | 5 | 5 | 5 | 95 | 100 | 2 | First Metal Layer | 1105 | 0.5 |
| I-204 | 1000 | 5 | 25 | 5 | 95 | 100 | 2 | First Metal Layer | 1105 | 0.5 |
| I-205 | 1000 | 5 | 5 | 5 | 99 | 3 | 1 | First Metal Layer | 1008 | 1 |
| I-206 | 1000 | 5 | 25 | 5 | 99 | 3 | 1 | First Metal Layer | 1008 | 1 |
| I-207 | 1000 | 5 | 5 | 5 | 99 | 10 | 1 | First Metal Layer | 1015 | 1 |
| I-208 | 1000 | 5 | 25 | 5 | 99 | 10 | 1 | First Metal Layer | 1015 | 1 |
| I-209 | 1000 | 5 | 5 | 5 | 99 | 25 | 1 | First Metal Layer | 1030 | 1 |
| I-210 | 1000 | 5 | 25 | 5 | 99 | 25 | 1 | First Metal Layer | 1030 | 1 |

TABLE 8

| Sample No. | Insulating Layer Thickness μm | Insulating Layer Young's Modulus GPa | First Metal Layer Coverage % | First Metal Layer Thickness μm | Second Metal Layer Coverage % | Second Metal Layer Thickness μm | Number of Layers | Metal Layer on a Surface with a High Ratio of Organic Resin | Total Thickness μm | Warpage mm |
|---|---|---|---|---|---|---|---|---|---|---|
| I-211 | 1000 | 5 | 5 | 5 | 99 | 100 | 2 | First Metal Layer | 1105 | 0.5 |
| I-212 | 1000 | 5 | 25 | 5 | 99 | 100 | 2 | First Metal Layer | 1105 | 0.5 |
| I-213 | 1000 | 5 | 17 | 1.5 | 95 | 3 | 1 | First Metal Layer | 1005 | 1 |
| I-214 | 1000 | 5 | 17 | 5 | 95 | 3 | 1 | First Metal Layer | 1008 | 1 |
| I-215 | 1000 | 5 | 17 | 10 | 95 | 3 | 1 | First Metal Layer | 1013 | 1 |
| I-216 | 1000 | 5 | 17 | 5 | 95 | 5 | 1 | First Metal Layer | 1010 | 1 |
| I-217 | 1000 | 5 | 17 | 1.5 | 95 | 10 | 1 | First Metal Layer | 1012 | 1 |
| I-218 | 1000 | 5 | 17 | 5 | 95 | 10 | 1 | First Metal Layer | 1015 | 1 |
| I-219 | 1000 | 5 | 17 | 10 | 95 | 10 | 1 | First Metal Layer | 1020 | 1 |
| I-220 | 1000 | 5 | 17 | 10 | 95 | 20 | 1 | First Metal Layer | 1030 | 1 |
| I-221 | 1000 | 5 | 17 | 1.5 | 95 | 25 | 1 | First Metal Layer | 1027 | 1 |
| I-222 | 1000 | 5 | 17 | 5 | 95 | 25 | 1 | First Metal Layer | 1030 | 1 |
| I-223 | 1000 | 5 | 17 | 10 | 95 | 25 | 1 | First Metal Layer | 1035 | 1 |
| I-224 | 1000 | 5 | 17 | 5 | 95 | 50 | 2 | First Metal Layer | 1055 | 1 |
| I-225 | 1000 | 5 | 17 | 1.5 | 95 | 100 | 2 | First Metal Layer | 1102 | 0.5 |
| I-226 | 1000 | 5 | 17 | 5 | 95 | 100 | 2 | First Metal Layer | 1105 | 0.5 |
| I-227 | 1000 | 5 | 17 | 10 | 95 | 100 | 2 | First Metal Layer | 1110 | 0.5 |
| I-228 | 1000 | 5 | 5 | 5 | 95 | 3 | 1 | First Metal Layer | 1008 | 1 |
| I-229 | 1000 | 5 | 25 | 5 | 95 | 3 | 1 | First Metal Layer | 1008 | 1 |
| I-230 | 1000 | 5 | 5 | 5 | 95 | 10 | 1 | First Metal Layer | 1015 | 1 |
| I-231 | 1000 | 5 | 25 | 5 | 95 | 10 | 1 | First Metal Layer | 1015 | 1 |
| I-232 | 1000 | 5 | 5 | 5 | 95 | 25 | 1 | First Metal Layer | 1030 | 1 |
| I-233 | 1000 | 5 | 25 | 5 | 95 | 25 | 1 | First Metal Layer | 1030 | 1 |
| I-234 | 1000 | 5 | 5 | 5 | 95 | 100 | 2 | First Metal Layer | 1105 | 0.5 |
| I-235 | 1000 | 5 | 25 | 5 | 95 | 100 | 2 | First Metal Layer | 1105 | 0.5 |
| I-236 | 1000 | 5 | 5 | 5 | 99 | 3 | 1 | First Metal Layer | 1008 | 1 |
| I-237 | 1000 | 5 | 25 | 5 | 99 | 3 | 1 | First Metal Layer | 1008 | 1 |
| I-238 | 1000 | 5 | 5 | 5 | 99 | 10 | 1 | First Metal Layer | 1015 | 1 |
| I-239 | 1000 | 5 | 25 | 5 | 99 | 10 | 1 | First Metal Layer | 1015 | 1 |
| I-240 | 1000 | 5 | 5 | 5 | 99 | 25 | 1 | First Metal Layer | 1030 | 1 |

TABLE 9

| Sample No. | Insulating Layer Thickness μm | Insulating Layer Young's Modulus GPa | First Metal Layer Coverage % | First Metal Layer Thickness μm | Second Metal Layer Coverage % | Second Metal Layer Thickness μm | Number of Layers | Metal Layer on a Surface with a High Ratio of Organic Resin | Total Thickness μm | Warpage mm |
|---|---|---|---|---|---|---|---|---|---|---|
| I-241 | 1000 | 5 | 25 | 5 | 99 | 25 | 1 | First Metal Layer | 1030 | 1 |
| I-242 | 1000 | 5 | 5 | 5 | 99 | 100 | 2 | First Metal Layer | 1105 | 0.5 |
| I-243 | 1000 | 5 | 25 | 5 | 99 | 100 | 2 | First Metal Layer | 1105 | 0.5 |
| I-244 | 65 | 5 | 5 | 5 | 85 | 3 | 1 | First Metal Layer | 73 | 4 |
| I-245 | 65 | 5 | 25 | 5 | 85 | 3 | 1 | First Metal Layer | 73 | 4 |
| I-246 | 65 | 5 | 5 | 5 | 85 | 10 | 1 | First Metal Layer | 80 | 4 |
| I-247 | 65 | 5 | 25 | 5 | 85 | 10 | 1 | First Metal Layer | 80 | 4 |
| I-248 | 65 | 5 | 5 | 5 | 85 | 25 | 1 | First Metal Layer | 95 | 5 |
| I-249 | 65 | 5 | 25 | 5 | 85 | 25 | 1 | First Metal Layer | 95 | 5 |
| I-250 | 65 | 5 | 5 | 5 | 85 | 100 | 2 | First Metal Layer | 170 | 5 |
| I-251 | 65 | 5 | 25 | 5 | 85 | 100 | 2 | First Metal Layer | 170 | 5 |
| I-252 | 65 | 5 | 17 | 1.5 | 95 | 25 | 1 | First Metal Layer | 91.5 | 5 |
| I-253 | 65 | 5 | 17 | 5 | 95 | 25 | 1 | First Metal Layer | 95 | 5 |
| I-254 | 65 | 5 | 17 | 10 | 95 | 25 | 1 | First Metal Layer | 100 | 5 |
| I-255 | 65 | 5 | 17 | 5 | 95 | 50 | 2 | First Metal Layer | 120 | 5 |
| I-256 | 65 | 5 | 17 | 1.5 | 95 | 100 | 2 | First Metal Layer | 166.5 | 5 |
| I-257 | 65 | 5 | 17 | 5 | 95 | 100 | 2 | First Metal Layer | 170 | 5 |
| I-258 | 65 | 5 | 17 | 10 | 95 | 100 | 2 | First Metal Layer | 175 | 5 |
| I-259 | 65 | 5 | 5 | 5 | 95 | 3 | 1 | First Metal Layer | 73 | 4 |
| I-260 | 65 | 5 | 25 | 5 | 95 | 3 | 1 | First Metal Layer | 73 | 4 |
| I-261 | 65 | 5 | 5 | 5 | 95 | 10 | 1 | First Metal Layer | 80 | 4 |
| I-262 | 65 | 5 | 25 | 5 | 95 | 10 | 1 | First Metal Layer | 80 | 4 |
| I-263 | 65 | 5 | 5 | 5 | 95 | 25 | 1 | First Metal Layer | 95 | 5 |
| I-264 | 65 | 5 | 25 | 5 | 95 | 25 | 1 | First Metal Layer | 95 | 5 |
| I-265 | 65 | 5 | 5 | 5 | 95 | 100 | 2 | First Metal Layer | 170 | 5 |
| I-266 | 65 | 5 | 25 | 5 | 95 | 100 | 2 | First Metal Layer | 170 | 5 |
| I-267 | 65 | 5 | 5 | 5 | 99 | 3 | 1 | First Metal Layer | 73 | 4 |

TABLE 9-continued

| | Insulating Layer | | First Metal Layer | | Second Metal Layer | | | Metal Layer on a | Total | |
|---|---|---|---|---|---|---|---|---|---|---|
| Sample No. | Thickness μm | Young's Modulus GPa | Coverage % | Thickness μm | Coverage % | Thickness μm | Number of Layers Layers | Surface with a High Ratio of Organic Resin | Thickness μm | Warpage mm |
| I-268 | 65 | 5 | 25 | 5 | 99 | 3 | 1 | First Metal Layer | 73 | 4 |
| I-269 | 65 | 5 | 5 | 5 | 99 | 10 | 1 | First Metal Layer | 80 | 4 |
| I-270 | 65 | 5 | 25 | 5 | 99 | 10 | 1 | First Metal Layer | 80 | 4 |

TABLE 10

| | Insulating Layer | | First Metal Layer | | Second Metal Layer | | | Metal Layer on a | Total | |
|---|---|---|---|---|---|---|---|---|---|---|
| Sample No. | Thickness μm | Young's Modulus GPa | Coverage % | Thickness μm | Coverage % | Thickness μm | Number of Layers Layers | Surface with a High Ratio of Organic Resin | Thickness μm | Warpage mm |
| I-271 | 65 | 5 | 5 | 5 | 99 | 25 | 1 | First Metal Layer | 95 | 5 |
| I-272 | 65 | 5 | 25 | 5 | 99 | 25 | 1 | First Metal Layer | 95 | 5 |
| I-273 | 65 | 5 | 5 | 5 | 99 | 100 | 2 | First Metal Layer | 170 | 5 |
| I-274 | 65 | 5 | 25 | 5 | 99 | 100 | 2 | First Metal Layer | 170 | 5 |
| I-275 | 65 | 5 | 17 | 1.5 | 95 | 3 | 1 | First Metal Layer | 69.5 | 4 |
| I-276 | 65 | 5 | 17 | 5 | 95 | 3 | 1 | First Metal Layer | 73 | 4 |
| I-277 | 65 | 5 | 17 | 10 | 95 | 3 | 1 | First Metal Layer | 78 | 4 |
| I-278 | 65 | 5 | 17 | 5 | 95 | 5 | 1 | First Metal Layer | 75 | 4 |
| I-279 | 65 | 5 | 17 | 1.5 | 95 | 10 | 1 | First Metal Layer | 76.5 | 4 |
| I-280 | 65 | 5 | 17 | 5 | 95 | 10 | 1 | First Metal Layer | 80 | 4 |
| I-281 | 65 | 5 | 17 | 10 | 95 | 10 | 1 | First Metal Layer | 85 | 4 |
| I-282 | 65 | 5 | 17 | 10 | 95 | 20 | 1 | First Metal Layer | 95 | 5 |
| I-283 | 65 | 5 | 17 | 1.5 | 95 | 25 | 1 | First Metal Layer | 91.5 | 4 |
| I-284 | 65 | 5 | 17 | 5 | 95 | 25 | 1 | First Metal Layer | 95 | 4 |
| I-285 | 65 | 5 | 17 | 10 | 95 | 25 | 1 | First Metal Layer | 100 | 4 |
| I-286 | 65 | 5 | 17 | 5 | 95 | 50 | 2 | First Metal Layer | 120 | 4 |
| I-287 | 65 | 5 | 17 | 1.5 | 95 | 100 | 2 | First Metal Layer | 166.5 | 4 |
| I-288 | 65 | 5 | 17 | 5 | 95 | 100 | 2 | First Metal Layer | 170 | 4 |
| I-289 | 65 | 5 | 17 | 10 | 95 | 100 | 2 | First Metal Layer | 175 | 4 |
| I-290 | 65 | 5 | 5 | 5 | 95 | 3 | 1 | First Metal Layer | 73 | 4 |
| I-291 | 65 | 5 | 25 | 5 | 95 | 3 | 1 | First Metal Layer | 73 | 4 |
| I-292 | 65 | 5 | 5 | 5 | 95 | 10 | 1 | First Metal Layer | 80 | 4 |
| I-293 | 65 | 5 | 25 | 5 | 95 | 10 | 1 | First Metal Layer | 80 | 4 |
| I-294 | 65 | 5 | 5 | 5 | 95 | 25 | 1 | First Metal Layer | 95 | 5 |
| I-295 | 65 | 5 | 25 | 5 | 95 | 25 | 1 | First Metal Layer | 95 | 5 |
| I-296 | 65 | 5 | 5 | 5 | 95 | 100 | 1 | First Metal Layer | 170 | 5 |
| I-297 | 65 | 5 | 25 | 5 | 95 | 100 | 1 | First Metal Layer | 170 | 5 |
| I-298 | 65 | 5 | 5 | 5 | 99 | 3 | 1 | First Metal Layer | 73 | 4 |
| I-299 | 65 | 5 | 25 | 5 | 99 | 3 | 1 | First Metal Layer | 73 | 4 |
| I-300 | 65 | 5 | 5 | 5 | 99 | 10 | 1 | First Metal Layer | 80 | 4 |

TABLE 11

| | Insulating Layer | | First Metal Layer | | Second Metal Layer | | | Metal Layer on a | Total | |
|---|---|---|---|---|---|---|---|---|---|---|
| Sample No. | Thickness μm | Young's Modulus GPa | Coverage % | Thickness μm | Coverage % | Thickness μm | Number of Layers Layers | Surface with a High Ratio of Organic Resin | Thickness μm | Warpage mm |
| I-301 | 65 | 5 | 25 | 5 | 99 | 10 | 1 | First Metal Layer | 80 | 4 |
| I-302 | 65 | 5 | 5 | 5 | 99 | 25 | 1 | First Metal Layer | 95 | 5 |
| I-303 | 65 | 5 | 25 | 5 | 99 | 25 | 1 | First Metal Layer | 95 | 5 |
| I-304 | 65 | 5 | 5 | 5 | 99 | 100 | 2 | First Metal Layer | 170 | 5 |
| I-305 | 65 | 5 | 25 | 5 | 99 | 100 | 2 | First Metal Layer | 170 | 5 |
| I-306 | 100 | 4 | 17 | 1.5 | 95 | 25 | 1 | First Metal Layer | 126.5 | 2 |
| I-307 | 100 | 4 | 17 | 5 | 95 | 25 | 1 | First Metal Layer | 130 | 2 |
| I-308 | 100 | 4 | 17 | 10 | 95 | 25 | 1 | First Metal Layer | 136 | 2 |

TABLE 11-continued

| | Insulating Layer | | First Metal Layer | | | Second Metal Layer | | Metal Layer on a Surface with a High Ratio of Organic Resin | Total | |
|---|---|---|---|---|---|---|---|---|---|---|
| Sample No. | Thickness μm | Young's Modulus GPa | Coverage % | Thickness μm | Coverage % | Thickness μm | Number of Layers Layers | | Thickness μm | Warpage mm |
| I-309 | 100 | 7 | 17 | 1.5 | 95 | 25 | 1 | First Metal Layer | 126.5 | 2 |
| I-310 | 100 | 7 | 17 | 5 | 95 | 25 | 1 | First Metal Layer | 130 | 2 |
| I-311 | 100 | 7 | 17 | 10 | 95 | 25 | 1 | First Metal Layer | 135 | 2 |
| I-312 | 100 | 3 | 17 | 5 | 95 | 25 | 1 | First Metal Layer | 130 | 4 |
| I-313 | 100 | 5 | 17 | 5 | 95 | 50 | 1 | First Metal Layer | 155 | 1.5 |
| I-314 | 100 | 5 | 5 | 5 | 95 | 3 | 1 | Second Metal Layer | 108 | 4 |
| I-315 | 100 | 5 | 25 | 5 | 95 | 3 | 1 | Second Metal Layer | 108 | 4 |
| I-316 | 100 | 5 | 5 | 5 | 95 | 10 | 1 | Second Metal Layer | 115 | 4 |
| I-317 | 100 | 5 | 25 | 5 | 95 | 10 | 1 | Second Metal Layer | 115 | 4 |
| I-318 | 100 | 5 | 5 | 5 | 95 | 25 | 1 | Second Metal Layer | 130 | 4 |
| I-319 | 100 | 5 | 25 | 5 | 95 | 25 | 1 | Second Metal Layer | 130 | 4 |
| I-320 | 100 | 5 | 5 | 5 | 95 | 100 | 2 | Second Metal Layer | 205 | 4 |
| I-321 | 100 | 5 | 25 | 5 | 95 | 100 | 2 | Second Metal Layer | 205 | 4 |

TABLE 12

| Sample No. | Antenna Pattern | First Metal Layer Thickness μm | Second Metal Layer Number of Layers Layers | Warpage mm | Radiation Characteristics of Antenna Ratio when the Maximum Value of the Measured Antenna Gain is set to 1 |
|---|---|---|---|---|---|
| II-1 | FIG. 3 | 1 | 2 | 5 | 0.84 |
| II-2 | FIG. 3 | 13 | 2 | 4 | 0.84 |
| II-3 | FIG. 3 | 5 | 1 | 2 | 0.85 |
| II-4 | FIG. 3 | 5 | 2 | 2 | 0.85 |
| II-5 | FIG. 6 | 5 | 2 | 2 | 1 |

TABLE 13

| Sample No. | Antenna Pattern | First Metal Layer Thickness μm | Second Metal Layer Number of Layers Layers | Warpage mm | Radiation Characteristics of Antenna Ratio when the Maximum Value of the Measured Antenna Gain is set to 1 |
|---|---|---|---|---|---|
| III-1 | FIG. 5 | 5 | 2 | 2 | 0.96 |
| III-2 | FIG. 7 | 5 | 2 | 2 | 1 |

TABLE 14

| Sample No. | Antenna Pattern | First Metal Layer Thickness μm | Second Metal Layer Number of Layers Layers | Warpage mm | Radiation Characteristics of Antenna Ratio when the Maximum Value of the Measured Antenna Gain is set to 1 |
|---|---|---|---|---|---|
| IV-1 | FIG. 4 | 5 | 2 | 2 | 0.98 |
| IV-2 | FIG. 5 | 5 | 2 | 2 | 1 |

As is clear from the results in Tables 1 to 11, the warpage values of each sample were 2 mm or less for the wiring boards (Sample No. I-53 to I-243, I-306 to I-311 and I-313) in which the first metal layer was placed on the first surface of the insulating layer which was mainly composed of organic resin and included inorganic particles, the second metal layer was placed on the second surface on the opposite side of the first surface, the thickness of the insulating layer was 75 μm or more and 1000 μm or less, the storage modulus was 4 GPa or more and 7 GPa or less, the thickness of the first metal layer was 1.5 μm or more and 10 μm or less, its coverage was 5% or more and 25% or less, the thickness of the second metal layer was 3 μm or more and 10 μm or less or 25 μm or more and 100 μm, its coverage was in the range of 85% or more, and the surface part of the insulating layer on the side where the first metal layer was disposed had a higher ratio of organic resin than the surface part of the insulating layer on the side where the second metal layer was disposed. In addition, the sample in which the second metal layer was formed in a two-layer structure showed higher flexibility than the sample in which the second metal layer was in a one-layer structure if the thickness of the second metal layer was the same.

As is clear from Table 12, in the wiring boards of the antenna patterns illustrated in FIGS. 3 and 6, the sample (Sample No. II-5) in which the linear conductor was curved was recognized to have higher radiation characteristics than the samples (Sample No. II-1 to 4) in which the linear conductors were formed in a straight line.

The samples illustrated in Table 13 also showed that Sample No. III-2 in which the linear conductor was curved had higher radiation characteristics than Sample No. III-1.

Furthermore, Table 14 showed that in the wiring board where three antenna patterns were provided, the sample (Sample No. IV-2) in which one of the three antenna patterns was asymmetrical by changing its orientation by 90° with respect to the orientation of the linear conductors configuring the other antenna patterns had higher radiation characteristics than the sample (Sample No. IV-1) in which all three antenna patterns faced the same direction.

DESCRIPTION OF THE REFERENCE NUMERAL

A, B, C, D, E, F, G wiring board
1 insulating layer
1a first surface
1b second surface
1c, 1d surface part
3 metal layer
3a first metal layer 3b second metal layer
10, 10a, 10b, 10c antenna pattern
11 patch conductor
13 linear conductor
15 power supply part
17 ground conductor
18 through-via
19 through-hole
19a inner wall
21 third metal layer

The invention claimed is:

1. A wiring board comprises:
an insulating layer having a first surface and a second surface on an opposite side of the first surface, and including organic resin having a highest volume in the insulating layer, and inorganic particles;
a first metal layer which is disposed on the first surface; and
a second metal layer which is disposed on the second surface, wherein
the insulating layer having:
a thickness of 75 μm or more and 1000 μm or less, and
a storage modulus of 4 GPa or more and 7 GPa or less,
the first metal layer having:
a thickness of 1.5 μm or more and 10 μm or less, and
a first metal layer coverage of 5% or more and 25% or less, wherein the first metal layer coverage is an area ratio of the first metal layer to the first surface
the second metal layer having:
a thickness of 3 μm or more and 10 μm or less or 25 μm or more and 100 μm or less, and
a second metal layer coverage of 85% or more, wherein the second metal layer coverage is an area ratio of the second metal layer to the second surface, and
a first ratio of the organic resin on the first surface is larger than a second ratio of the organic resin on the second surface.

2. The wiring board according to claim 1, wherein
the first metal layer comprises a plurality of antenna patterns and each of the plurality of antenna patterns includes a patch conductor and a linear conductor,
the first surface has a rectangular shape, and
the plurality of antenna patterns differ in at least one of number, area, and orientation between two regions across a virtual line, when the virtual line is perpendicular to a side of the insulating layer and is disposed at a center of the first surface.

3. The wiring board according to claim 2, wherein the linear conductor is bent between two adjacent patch conductors.

4. The wiring board according to claim 1, wherein the second metal layer has a layered structure if a thickness of the second metal layer is 25 μm or more and 100 μm or less.

5. The wiring board according to claim 1, wherein
the insulating layer, the first metal layer, and the second metal layer are penetrated by a through-hole in the thickness direction,
a third metal layer is on an inner wall of the through-hole, and
the third metal layer extends from the inner wall and is layered with the first metal layer and the second metal layer, respectively.

* * * * *